(12) United States Patent
Tayebati et al.

(10) Patent No.: US 9,325,144 B2
(45) Date of Patent: Apr. 26, 2016

(54) TWO-DIMENSIONAL MULTI-BEAM STABILIZER AND COMBINING SYSTEMS AND METHODS

(71) Applicant: TeraDiode, Inc., Wilmington, MA (US)

(72) Inventors: Parviz Tayebati, Sherborn, MA (US); Bien Chann, Merrimack, NH (US)

(73) Assignee: TeraDiode, Inc., Wilmington, MA (US)

( * ) Notice: Subject to any disclaimer, the term of this patent is extended or adjusted under 35 U.S.C. 154(b) by 0 days.

(21) Appl. No.: 13/766,923

(22) Filed: Feb. 14, 2013

(65) Prior Publication Data

US 2015/0333485 A1 Nov. 19, 2015

Related U.S. Application Data

(60) Provisional application No. 61/598,470, filed on Feb. 14, 2012.

(51) Int. Cl.
| | |
|---|---|
| *H01S 5/40* | (2006.01) |
| *G02B 27/10* | (2006.01) |
| *H01S 3/082* | (2006.01) |
| *H01S 5/00* | (2006.01) |
| *H01S 5/14* | (2006.01) |
| *H01S 3/08* | (2006.01) |

(52) U.S. Cl.
CPC .......... *H01S 3/0826* (2013.01); *G02B 27/1006* (2013.01); *H01S 5/005* (2013.01); *H01S 5/141* (2013.01); *H01S 5/4012* (2013.01); *H01S 5/4068* (2013.01); *H01S 5/4087* (2013.01); *H01S 3/08054* (2013.01); *H01S 5/143* (2013.01)

(58) Field of Classification Search
CPC ...... H01S 3/10; H01S 5/4012; G02B 27/1006
USPC .............................. 359/487.04; 372/30, 29.02
See application file for complete search history.

(56) References Cited

U.S. PATENT DOCUMENTS

| | | | | |
|---|---|---|---|---|
| 6,275,512 B1* | 8/2001 | Fermann | .................. | H01S 3/067 372/102 |
| 6,332,689 B1* | 12/2001 | Shirasaki | ......... | H04B 10/25133 359/577 |
| 7,689,086 B2* | 3/2010 | Magnusson | ............ | G02B 6/124 385/129 |
| 2004/0012844 A1* | 1/2004 | Ohtsuki | ............. | B23K 26/0643 359/341.1 |
| 2009/0220233 A1* | 9/2009 | Presley | ................ | G02B 6/3544 398/79 |
| 2011/0310921 A1* | 12/2011 | Chann | ................ | G02B 27/0905 372/70 |

OTHER PUBLICATIONS

Drever et al., "Laser Phase and Frequency Stabilization Using an Optical Resonator", Feb. 1983, Springer-Verlag, Appl. Phys. B 31, 97-105.*

* cited by examiner

*Primary Examiner* — Bumsuk Won
*Assistant Examiner* — William R Alexander
(74) *Attorney, Agent, or Firm* — Morgan, Lewis & Bockius LLP

(57) ABSTRACT

A system and method for stabilizing and combining multiple emitted beams into a single system using both WBC and WDM techniques.

20 Claims, 16 Drawing Sheets

Wavelength Stabilizer Cavity

Wavelength Combiner

Wavelength Stabilizer Cavity

Wavelength Combiner

TWO-DIMENSIONAL MULTI-BEAM STABILIZER AND COMBINING SYSTEMS AND METHODS

CROSS-REFERENCE TO RELATED APPLICATIONS

This application claims priority under 35 U.S.C. §119 to the following U.S. Provisional Patent Application, which is hereby incorporated by reference in its entirety: U.S. Ser. No. 61/598,470 filed Feb. 14, 2012.

COPYRIGHT INFORMATION

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present embodiments relate generally to laser systems and more particularly to wavelength beam combining systems and methods.

2. Description of the Prior Art

Wavelength beam combining (WBC) and Wavelength-division multiplexing (WDM) systems have been developed to scale up power for a single output beam (comprised of a plurality of wavelengths) to be used in a variety of applications. However, the optical architecture of previous high power systems often requires certain optical elements in those WBC or WDM systems to withstand high amounts of thermal loading, which leads to expensive and high cost systems. What is needed are alternative systems that divert thermal loading and allow for lower cost components to be used, as well as enable simpler manufacturing and set up.

The present systems and methodologies described herein seek to combine WDM and WBC techniques into a common system achieve lower thermal loading, allow for lower tolerance components and be more flexible scalable high power and brightness systems.

The following application seeks to solve the problems stated.

SUMMARY OF THE INVENTION

A system for stabilizing and combining multiple beams to be emitted as a high brightness multi-wavelength beam comprising a stabilizer/resonator system in conjunction with a beam combiner system.

In one embodiment, a transform lens and other optical elements are shared between each system.

In one embodiment, a diffraction grating is utilized by both systems.

In one embodiment, $0^{th}$ order feedback is used to wavelength stabilize the emitters in the resonator/stabilizer portion.

DETAILED DESCRIPTION OF THE PREFERRED EMBODIMENT

Aspects and embodiments relate generally to the field of scaling laser sources to high-power and high-brightness using wavelength beam combining techniques. More particularly, methods for increasing brightness, stability, and effectiveness of wavelength beam combining systems.

Embodiments described herein include addressing: 1) increasing output power and brightness through combining multiple emitters in a common system incorporating WDM and WBC techniques. Through the various embodiments and techniques described herein a stabilized, high brightness multi-wavelength output laser system may be achieved.

The approaches and embodiments described herein may apply to one and two-dimensional beam combining systems along the slow-axis, fast-axis, or other beam combining dimension. For purposes of this application optical elements may refer to any of lenses, mirrors, prisms and the like which redirect, reflect, bend, or in any other manner optically manipulate electromagnetic radiation. Additionally, the term beam includes electromagnetic radiation. Beam emitters include any electromagnetic beam-generating device such as semiconductor elements, which generate an electromagnetic beam, but may or may not be self-resonating. These also include fiber lasers, disk lasers, non-solid state lasers, diode lasers and so forth. Generally each emitter is comprised of a back reflective surface, at least one optical gain medium, and a front reflective surface. The optical gain medium refers to increasing the gain of electromagnetic radiation and is not limited to the visual, IR or ultraviolet portions of the electromagnetic spectrum. An emitter, may be comprised of multiple beam emitters such as a diode bar configured to emit multiple beams.

Wavelength beam combining is a proven method for scaling the output power and brightness from diode elements. Here we disclose a new method for side-by-side spatial and wavelength beam combining in a common system. The central concept consists of a single-resonator multi-wavelength stabilizer and a separate wavelength combiner for two-dimensional diode elements. One goal and outcome of the embodiments described herein is to create a plurality of unique wavelengths that are stabilized and resonating in a multi-cavity system configured to be combined or overlapped into a common beam profile.

Wavelength Stabilizing/Wavelength Combining

Figure 1:
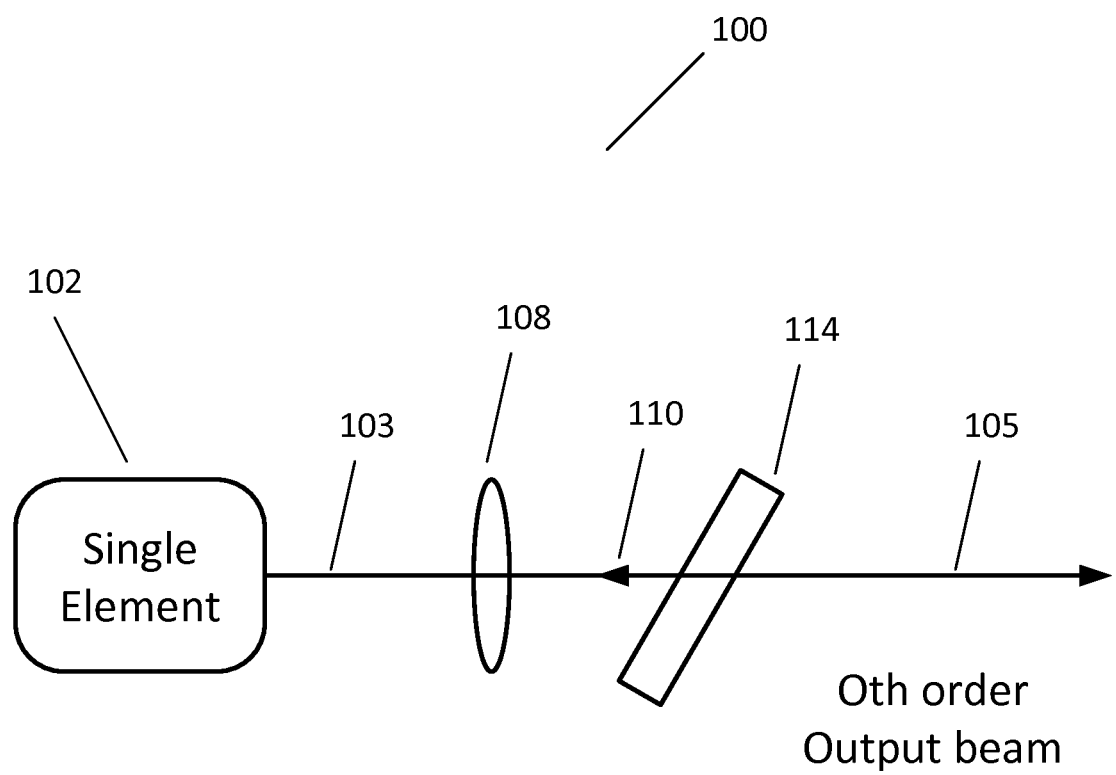
FIG. 1 illustrates a Littrow resonator.

There are several methods for wavelength stabilizing diode elements. FIG. 1 shows a well-known Littrow resonator 100 for stabilizing a single radiation emitter 102 into a narrowed and well defined wavelength 105. Typically the optical architecture 100 consists of a transform optic or collimation optics 108 and a diffraction grating 114. The transform optics 108 collimates the emission 103 from the single emitter 102, such as a diode element. Usually the emitted beam, after the transform optics, has a very long Raleigh range, so placement of the diffraction grating 114 is less critical. The first order produced from the grating 114 by diffracting the emitted beam 103 is used as feedback 110. A resonator is formed between the back facet of the single emitter 102 (diode element) and the diffraction grating 114.

Figure 2A:
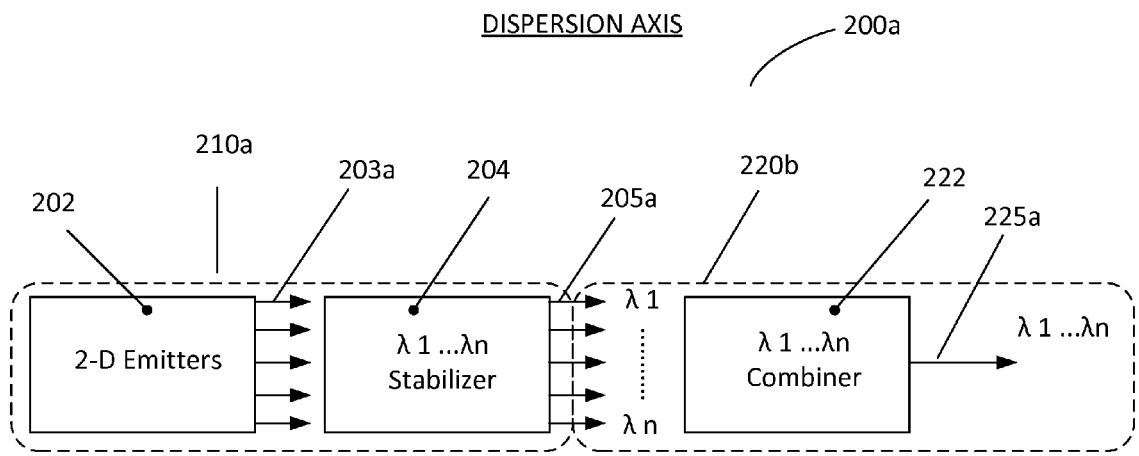
FIGS. 2A-B illustrate a schematic of a wavelength resonator and wavelength combiner system.
Figure 2B:
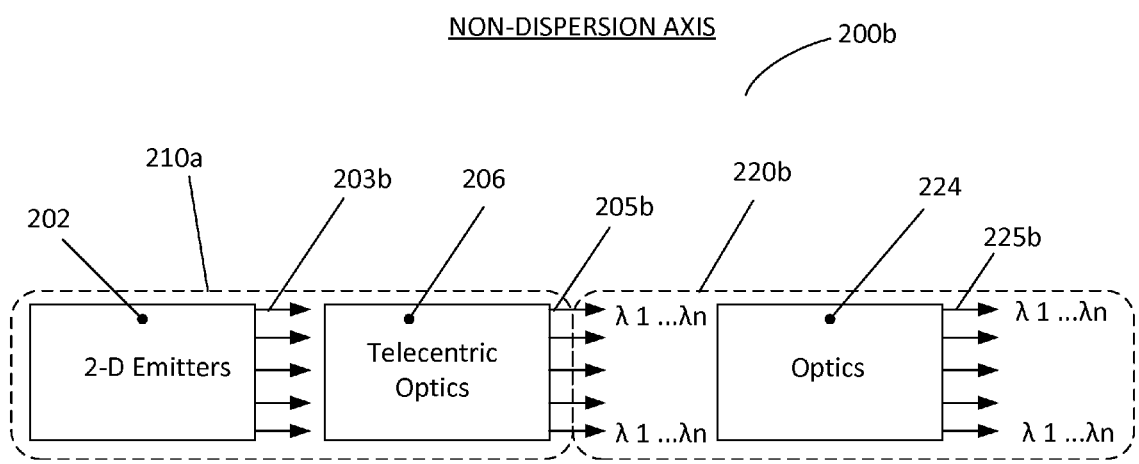

As mentioned, one purpose of this application is to provide a multi-wavelength stabilizer and a separate wavelength combiner for two-dimensional diode elements. FIGS. 2A-B help illustrate this central concept. The left sides of FIGS. 2A-B show a multi-wavelength stabilizer resonator 210a-b. The right sides of FIGS. 2A-B show a wavelength combiner 220a-b. Generally fundamental to any wavelength stabilization resonator and wavelength combiner is a dispersive element. For purposes of this disclosure we assume that dispersion occurs along one optical axis only, unless otherwise specified. Along the dispersion dimension (FIG. 2A) the main function of the multi-wavelength stabilizer resonator 210a is to stabilize each emitter 202 (such as an optical gain element or other radiation producing element described above) along this dispersion dimension to produce a unique and well-defined or distinct wavelength(s) output 205a having a narrow bandwidth. A stabilizer 204 may include a dispersive element and optical elements configured to take the emitted beams 203a and return at least a portion of those beams into the emitters 202 having well-defined or unique wavelengths that are generally narrow in bandwidth.

Along the non-dispersion dimension, (FIG. 2B) the main function of the resonator 210b is to form a resonator for each of the diode or other optical gain elements 202. The main function of the wavelength combiner 220a-b is to take the two-dimensional beams from the stabilizer resonator 210a-b and generate a one-dimensional beam. Along the dispersion axis 200a the combiner 222 takes multiple input beams 205a and overlaps and/or combines each into a single beam profile 225a. The single profile is comprised of a plurality of unique wavelengths overlapped along at least one dimension. The stabilized unique wavelengths allow for this single profile to be formed while maintaining high brightness levels. Along the non-dispersion axis 200b the optical elements 224, such as telecentric optics, receive input beams 205b and generate the same output beams 225b with little or no degradation in output beam quality. In summary, two systems are combined to manage unique wavelength stabilization and efficient beam combination to produce a high brightness and high output power multi-beam profile.

Wavelength Stabilizing Cavities

Figure 3A:
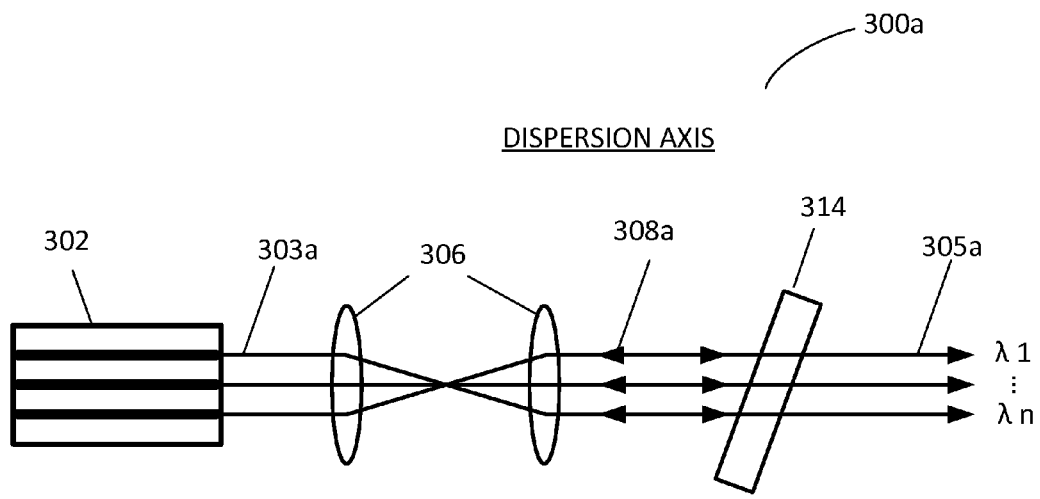
FIGS. 3A-B illustrate an embodiment of a wavelength stabilizer cavity.
Figure 3B:
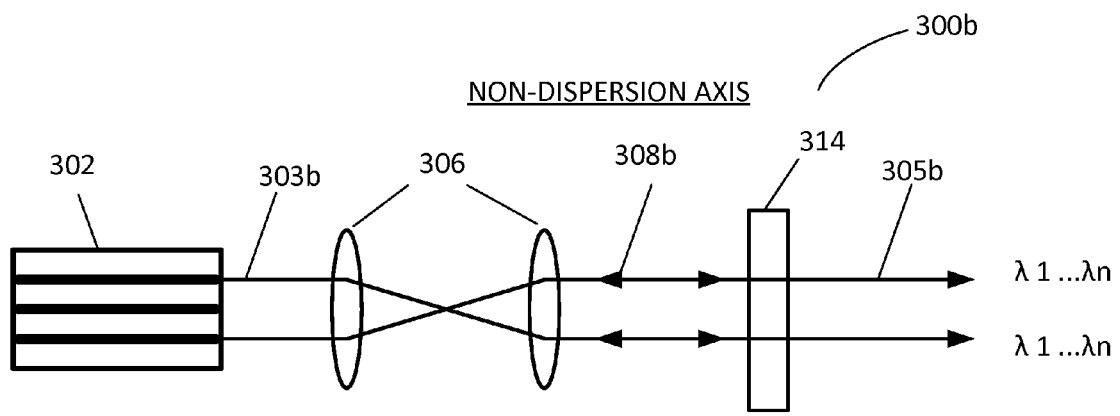

FIGS. 3A and 3B show one embodiment for generating multi-wavelength-stabilized elements using a variation of the Littrow resonator. The embodiment uses a chirped grating 314. In both dimensions, a single telecentric optic system 306 is used. As shown, in its simplest form, the telecentric optics 306 used comprise of a two-lens con-focal setup. The chirped grating 314 may be a surface grating or volume grating. In this embodiment it is only chirped along one dimension, 300a. In both the dispersive dimension 300a and non-dispersive dimension 300b, the emitters 302 have the same incidence angle onto the grating 314. The diffracted beams 308a-b, from each emitter is used as feedback to form a stable resonator. Since the grating 314 is chirped each emitter is stabilized to a unique and defined wavelength by the resonator formed between the chirped grating 314 and back reflective facet of each emitter (not labeled). The output beam 305a is taken from the zero order of the grating 314. The embodiment disclosed in FIGS. 3A and 3B and other embodiments describe below may include a multi-cavity system wherein multiple resonating cavities are created. These resonating cavities may include a back facet reflector formed on one end of a radiation element or emitter and any combination of or individual effective reflectivity of the front facet (not shown), dispersive element (or diffraction grating), partially or fully reflective mirror, and/or any other reflective optical element used in the system. Some of these reflective optical elements, such as the chirped grating shown in FIGS. 3A and 3B, act as a common reflector to multiple emitters, wherein a common system is created. This common system is one where multiple resonating cavities are created using the same reflective optical element in part to create their respective cavities. Thus, stabilizing each of the beams emitted by a plurality of emitters. The output 305a-b of the wavelength stabilizing system shown in FIGS. 3A-B may be the input to the wavelength beam combiner in FIGS. 4A and 4B.

Figure 5A:
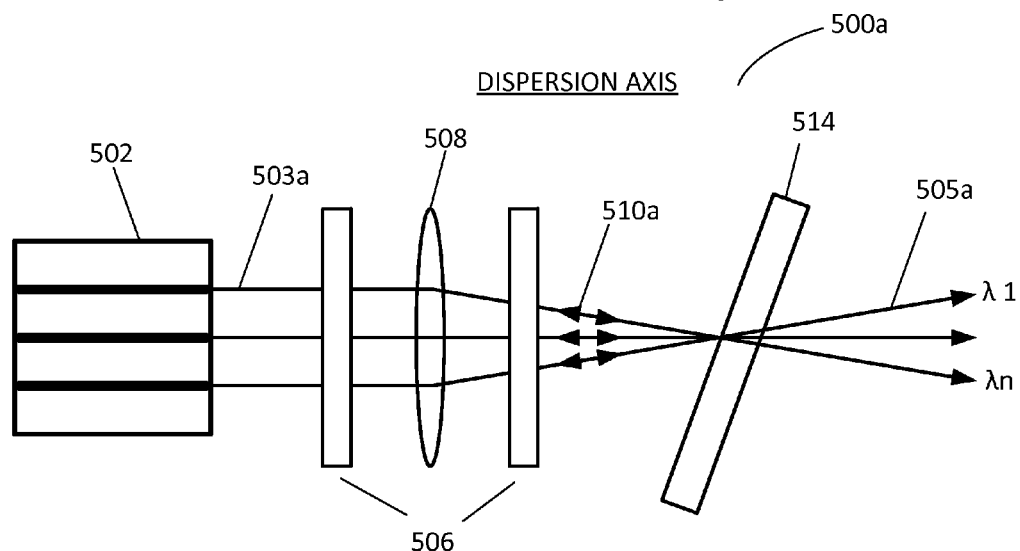
FIGS. 5A-B illustrate an embodiment of a wavelength stabilizer cavity.
Figure 5B:
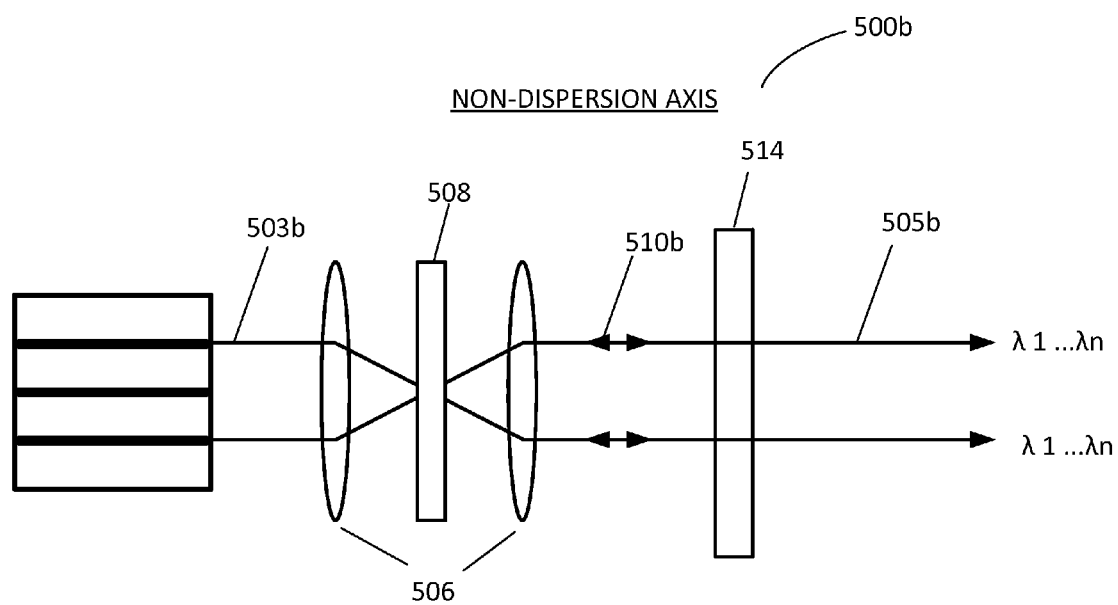

FIGS. 5A-B illustrate the dispersive and non-dispersive architecture of another wavelength stabilizing using a variation of a Littrow resonator for stabilizing the 2-D emitters to desired wavelengths using a constant groove density grating 514. Here along the dispersion dimension 500a a transform optic 508 is used. The main function of the transform optic(s) 508 is to convert unique near field positions of the diode emitters 502 into unique angles onto the density grating 514. Feedback 510a-b from grating 514 is redirected back into elements 502 where a resonator system is formed with each of the emitted beams having a unique wavelength. FIG. 5B shows the cavity along the non dispersion dimension 500b. Here only telecentric optics 506 are used along the non-dispersion direction to ensure feedback 510b is redirected into each of the emitters of 502, thus stabilizing resonance along this dimension. The telecentric optics 506 as shown are comprised of two cylindrical lenses. The output beam 505a-b is a result of the zero order dispersion of grating 514. The output 505a-b may used as input for the wavelength combiner in FIGS. 6A and 6B.

Figure 7:
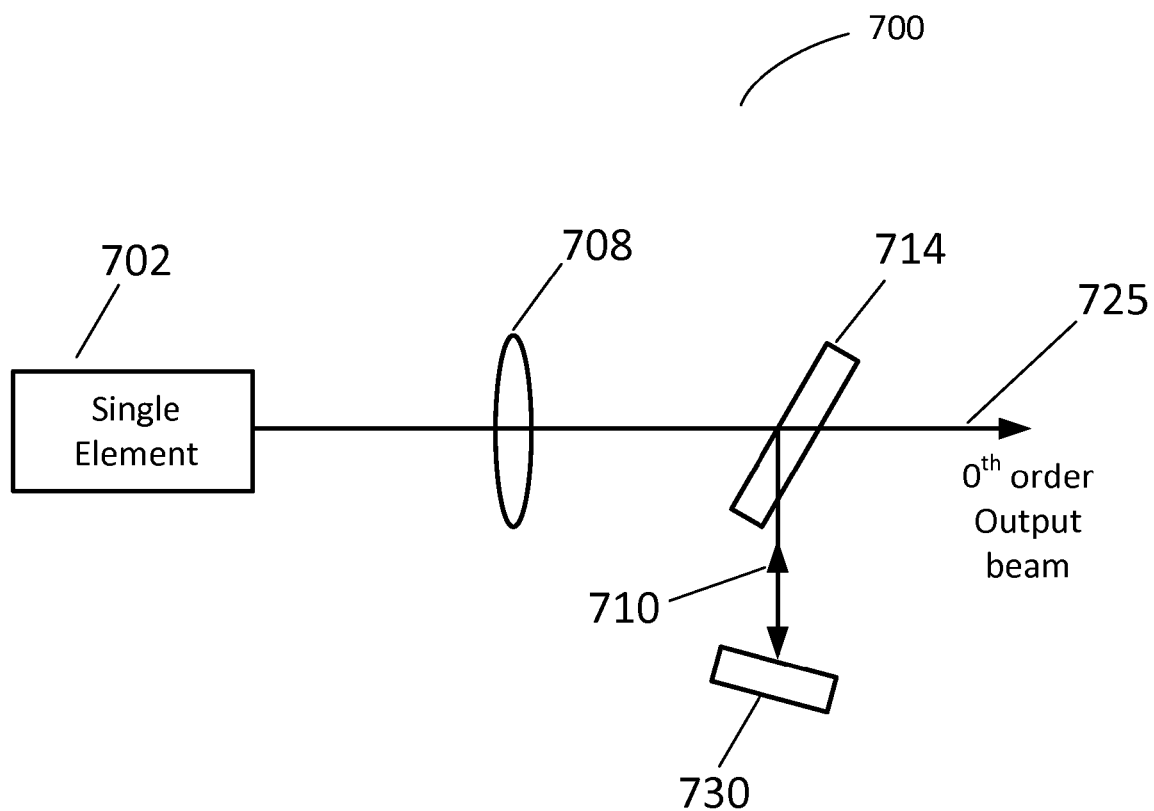
FIG. 7 illustrates a Littman-Metcalf external-cavity system.

FIG. 7 shows a conventional Littman-Metcalf external-cavity system 700 for a single gain element/emitter 702. System 700 consists of a single optical gain element 702, collimation or transforms optics 708, a dispersive element 714, and a totally reflective surface/mirror 730 positioned to receive one of the diffracted orders of 714. A resonator is formed between the back facet of the diode element 702 and the mirror 730 as feedback 710 is redirected by the mirror 730 back to the diffraction grating 714, through 708 into the diode element 702. The output beam 725 here is provided from the zero order of the dispersive grating 714.

Figure 8A:
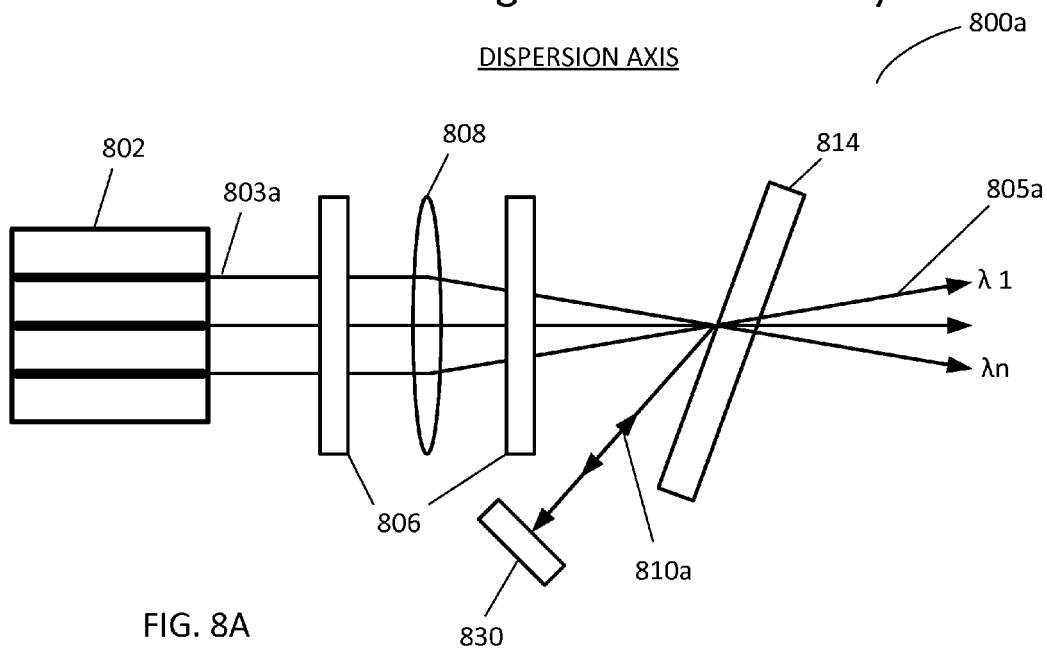
FIGS. 8A-B illustrate an embodiment of a wavelength stabilizer cavity using a reflective surface.
Figure 8B:
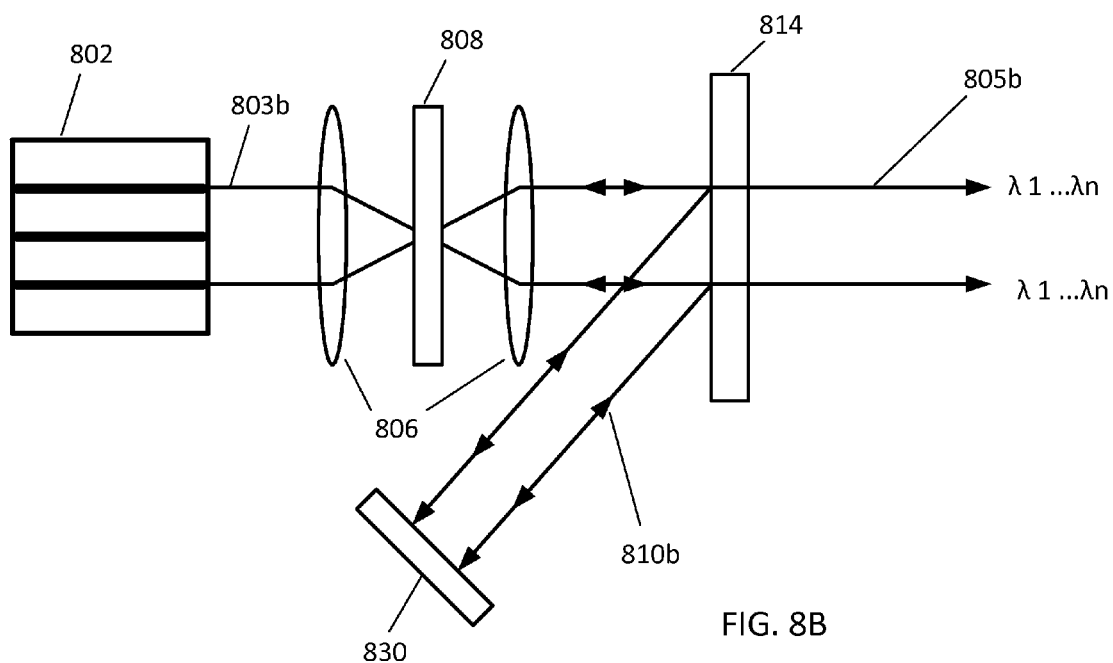

FIGS. 8A-B illustrate a method for stabilizing two-dimensional (2-D) elements 802 to the desired wavelengths incorporating a reflective surface 830. This variation of Littman-Metcalf cavity 700 is configured for use with 2-D emitters. Along the dispersion axis 800*a* each diode emitter 802 has a unique angle of incidence. Transform optical element 808, having power in the dispersive dimension, but not in the non-dispersive dimension, is used in part to help create these unique angles of incidence for each of the emitted beams 803*a*. The first order of diffracted beams from diffraction grating 814 propagates to the mirror 830. A resonator is formed between the back facet (not labeled) of each of the diode emitters 802 and the mirror 830 by feedback 810*a-b*. As such each emitter along the dispersion axis is stabilized to provide a unique and well-defined wavelength. Along the non-dispersion axis 800*b* a telecentric optic 806, having focal power only in this dimension, is used to redirect feedback 810*b* into emitters 802 and establish resonance along this dimension. The telecentric-optic(s) 806 optically transfers the beam waist of each emitter and projects it onto the mirror, wherein the mirror acts as common reflector for the emitters to create multiple resonating cavities. The output beam is taken from the zero order of the grating. In this configuration all the optics (806,808) are cylindrical lenses. It should be noted that different orders of light may be used for feedback in the various embodiments described herein, as well as output and are within the scope of this application.

Figure 9A:
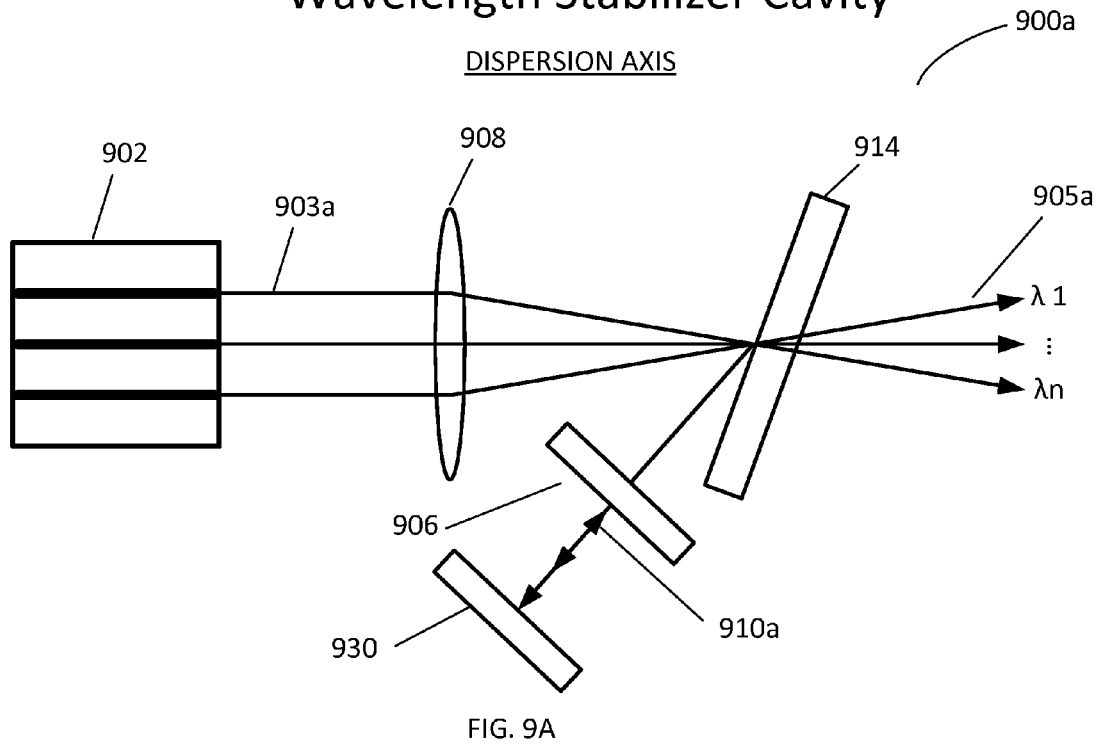
FIGS. 9A-B illustrate another embodiment of a wavelength stabilizer cavity using a reflective surface.
Figure 9B:
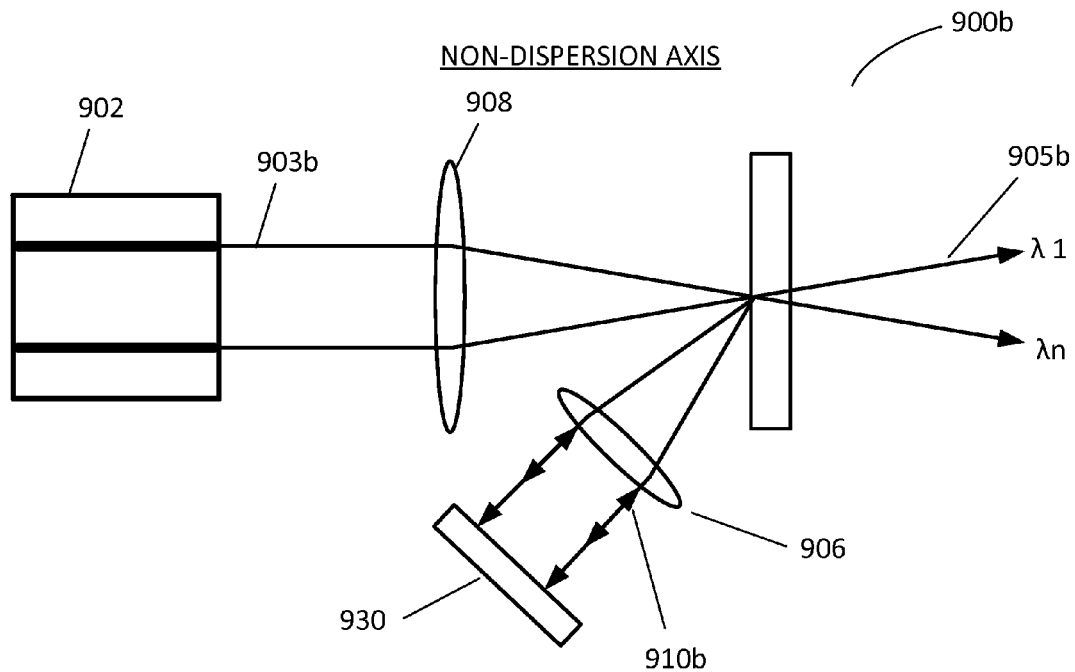

FIGS. 9A-B illustrate another method for stabilizing 2-D elements 902 to the desired wavelengths incorporating a reflective surface 930. However, in this embodiment telecentric optic 906 is placed between grating 914 and mirror 930, 906 only has power in the non-dispersive dimension 900*b*, but can be used in conjunction with transform optic 908, here having power in both dimensions (900*a-b*) to form a telescoping system for stabilizing the emitted beams 903*b* and feedback 910*b* to form a resonant system along the non-dispersive dimension 900*b*. Transform optic 908 may be a spherical lens that causes beams 903*a* to converge along the dispersive dimension 900*a* onto diffraction grating 914. Again feedback 910*a* provide wavelength stabilized feedback along this dimension between the back facet of emitters 902 and mirror 930. The output 905*a-b* of FIGS. 9A and 9B and 805*a-b* may be used as input for the combiner of FIGS. 10A and 10B.

The previous output beams, from the above wavelength stabilized configurations, are generally taken from the zero order of the dispersive component or grating. The output beam can also be taken intra-cavity (FIGS. 12A-B) or from another facet (FIGS. 11A-B).

Figure 11A:
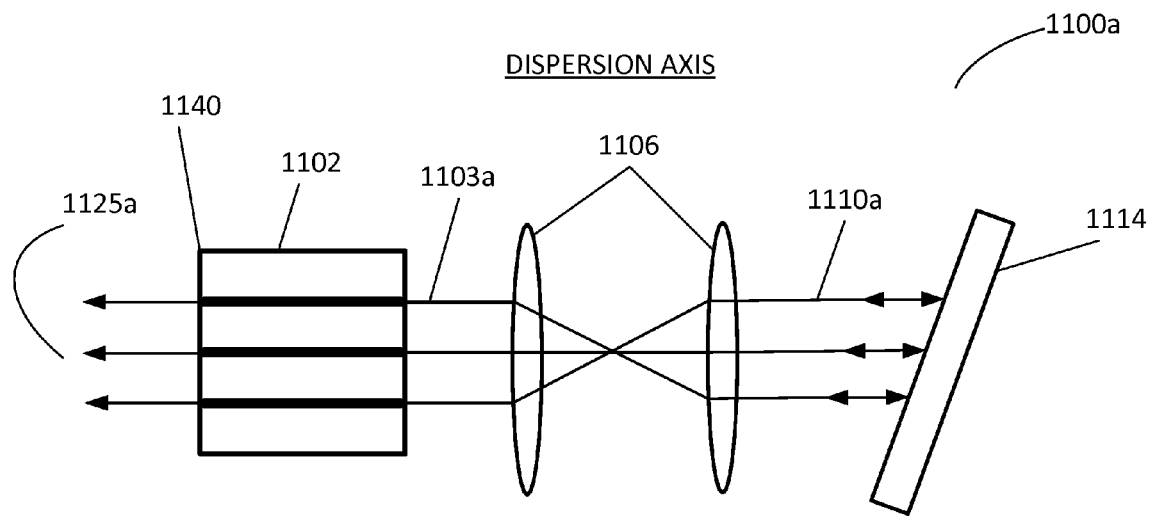
FIGS. 11A-B illustrate an embodiment of a wavelength stabilizer cavity emitting stabilized beams out of the back facet of an optical gain medium.
Figure 11B:
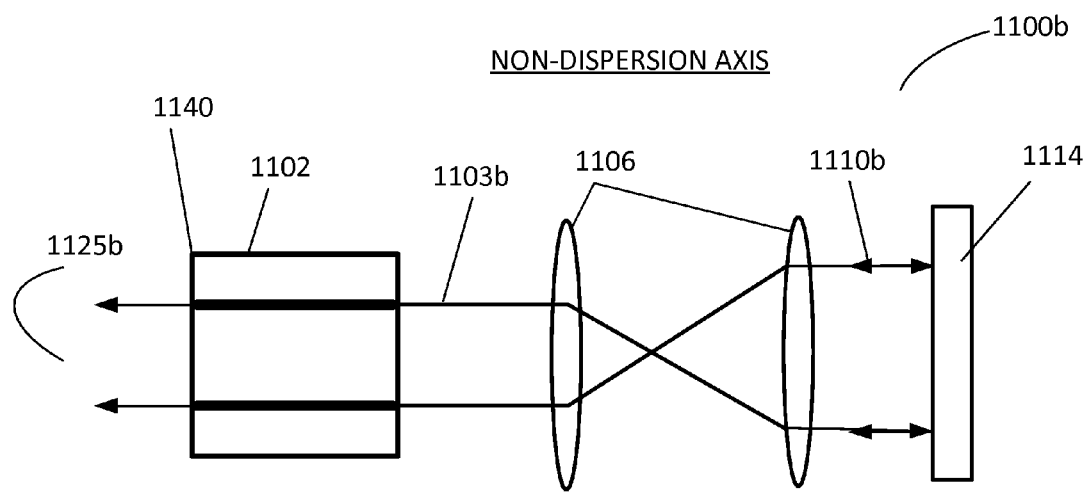

FIGS. 11A-B illustrate an embodiment of a wavelength stabilizer cavity emitting stabilized beams where the output beam is taken or emitted from the back facet 1140. Emitted beams 1103 pass through telecentric optics 1106 onto chirped grating 1114 where they are dispersed into orders and feedback 1110*a-b* is passed back towards emitters 1102 forming a stabilized system. The output beams 1125*a-b* are then emitted from the back facet 1140 of emitters 1102. Telecentric optics 1106 have power in both the dispersive 1100*a* and non-dispersive 1100*b* dimensions. Output 1125*a-b* may then be used in conjunction with a wavelength combiner system.

Figure 12A:
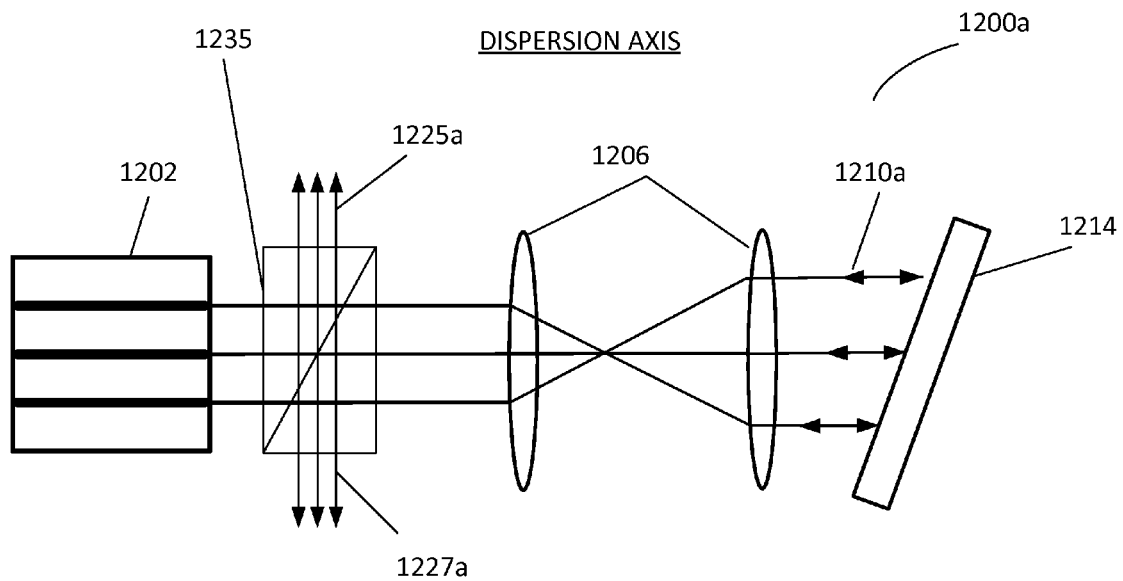
FIGS. 12A-B illustrate an embodiment of a wavelength stabilizer cavity emitting stabilized beams using a polarized cube.
Figure 12B:
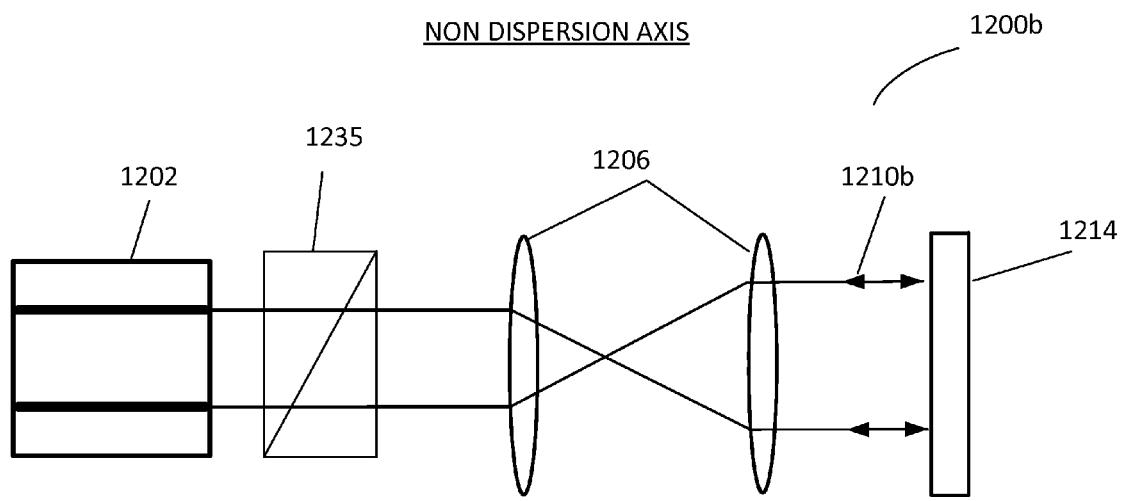

FIGS. 12*a-b* illustrate a configuration where the output beams 1225*a* and 1227*a* are taken directly within the cavity. The preferred choice depends on many parameters, one of which is the efficiency of the grating 1214. For example, it may be preferred to take the output beams from the zero order of the grating if the efficiency of the grating is low. Preferably the effective feedback 1210*a-b* from chirped grating 1214 is comparable to the reflectivity of the diode facet(s) of emitters 1202 when optimized for output power. The configuration as shown in FIGS. 11A and 11B may be preferred for very robust wavelength locking where the grating needs to be optimized to efficiently operate. The main difference with the configuration in FIGS. 11A-B is the need to have both facets of the diode emitters accessible. Intra-cavity extraction as shown in FIGS. 12A and 12B, may be a preferred method for multiple output beams. Output 1227*a* may be an order that has little light or power in it and in some embodiments is redirected to a beam dump. In other embodiments a recycling system using reflective surfaces and/or additional optical elements to redirect and the output beams is also contemplated. Output 1225*a* comes by way of using a polarizing or beam splitter optical element, such as a polarizing cube, to send a majority of the light out of the system while passing a smaller percentage onto chirped grating 1214 to disperse the light into unique wavelengths and send the stabilizing feedback into emitter 1202.

Wavelength Combiners

Figure 4A:
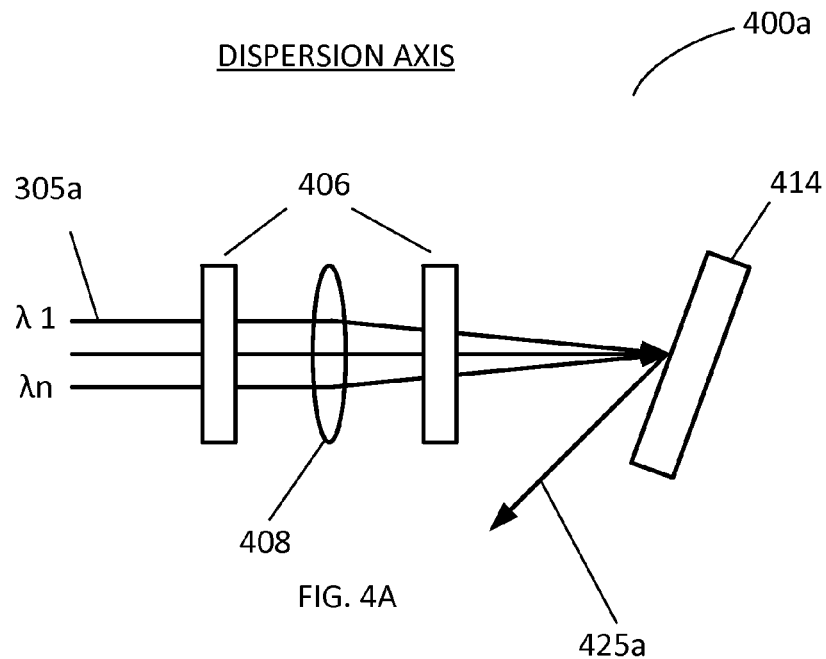
FIGS. 4A-B illustrate an embodiment of a wavelength combiner.
Figure 4B:
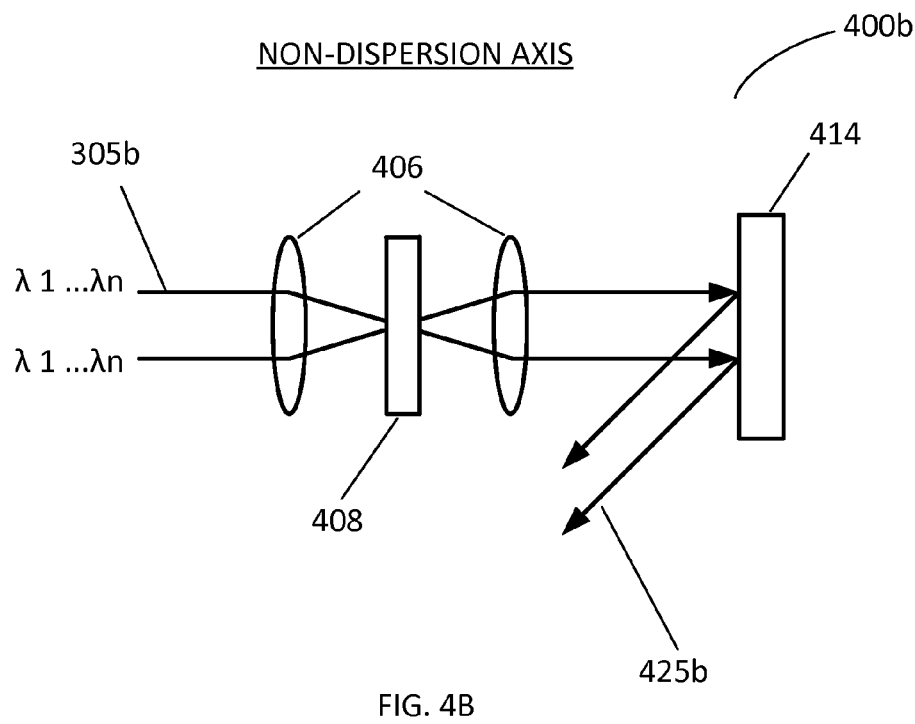

FIGS. 4A and 4B show a wavelength and spatial beam combiner configured to receive the output 305*a-b* from the wavelength stabilizer configuration shown in FIGS. 3A-B. Along the dispersion dimension 400*a*, transform optic(s) 406 and grating 414 combine the output/input 305*a* into a single beam as illustrated in FIG. 4A. Along the non-dispersion axis 400*b* (FIG. 4B) telecentric optics 406 comprised of cylindrical optics help reproduce the same incidence angle as the resonator from FIGS. 3A-B. As such, ideally, the optics will preserve the quality of input beam 305*b*. Any deviations from this generally result in degradation of beam quality. These deviations include non-ideal matching of transform optics and grating combination, position of grating at other places/positions besides where the chief rays are overlapped, and non-telecentric optics along the non-dispersion axis. It should be noted in this configuration transform optic(s) 408 have power along the dispersion 400*a* dimension to direct 305*a* to converge towards 414. Telecentric optics 406 similarly only have power in the non-dispersion dimension 400*b*. Output 425 is then comprised of a combined multiple wavelength beam 425*a* along the dispersion dimension 400*a* while the output 425*b* along the non-dispersion dimension maintains the original array or number of emission beams from a 2-D profile.

Figure 6A:
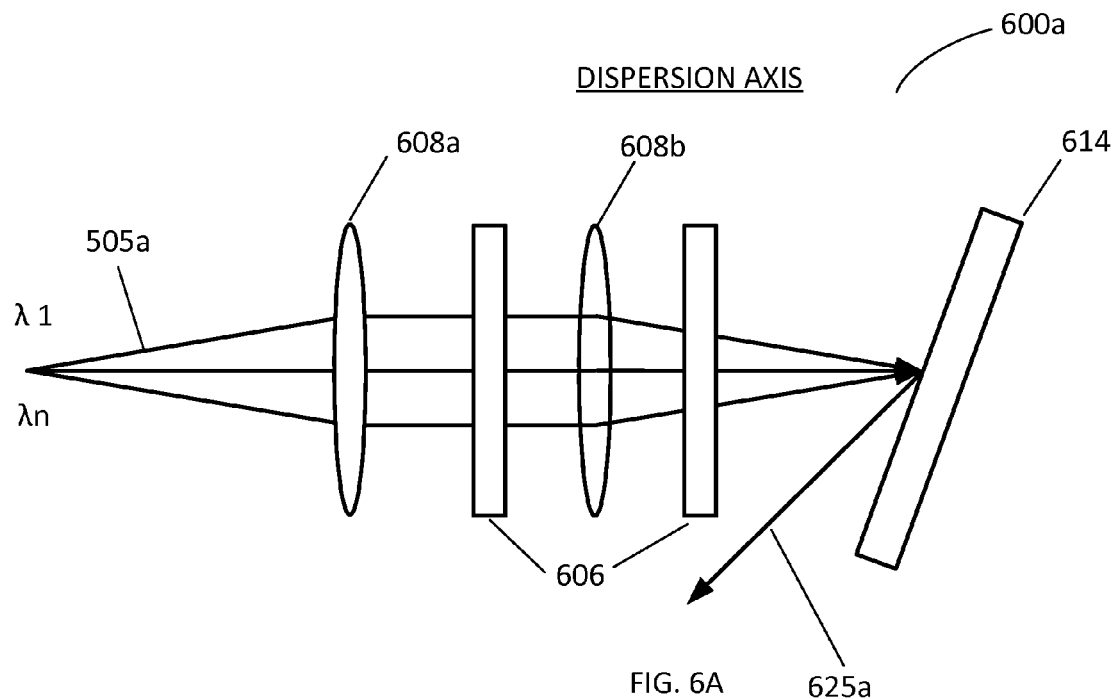
FIGS. 6A and 6B illustrate an embodiment of a wavelength combiner.
Figure 6B:
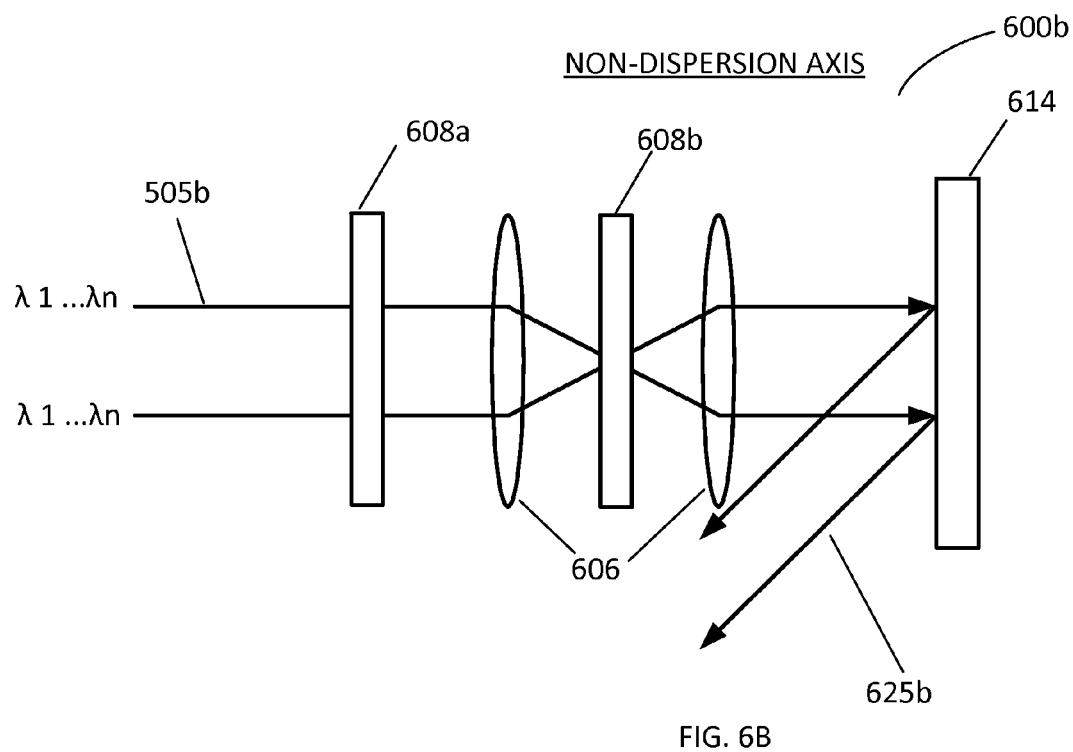

FIGS. 6A and 6B show a beam combiner configured to receive the output 505*a-b* from the wavelength stabilizer configuration shown in FIGS. 5A-B. The optical elements along the dispersion dimension/axis 600*a* include a collimator 608*a*, transform optic 608*b* and grating 614. The collimator 608*a* is configured to collimate the chief rays from input 505*a* and used with transform optic 608*b* to converge or overlap the beams onto grating 614. The combination of the two optical elements and grating can be chosen to match the wavelength bandwidth of the diode elements. Along the non-dispersion dimension 600*b* all of the chief rays are parallel. A cylindrical telescope 606 comprised of cylindrical optics again help reproduce the same incidence angle as the resonator from FIGS. 5A-B and preserve the quality of input beam 505*b*. As shown in FIGS. 6A and 6B, there are four cylindrical lenses (606*a-b*, 608). Some of these lenses may be combined into a single spherical lens such that it performs the same functions as just described. For example, two spherical lenses may replace the 4 cylindrical lenses wherein the output beam 625*a-b* would still be the same.

Figure 10A:
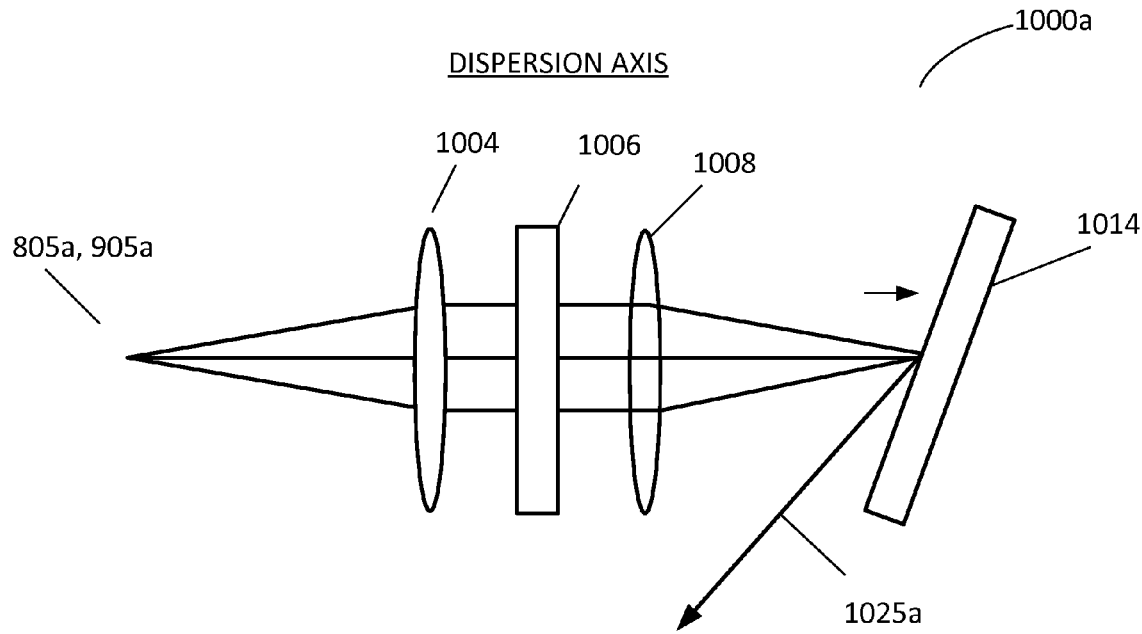
FIGS. 10A-B illustrate an embodiment of a wavelength combiner.
Figure 10B:
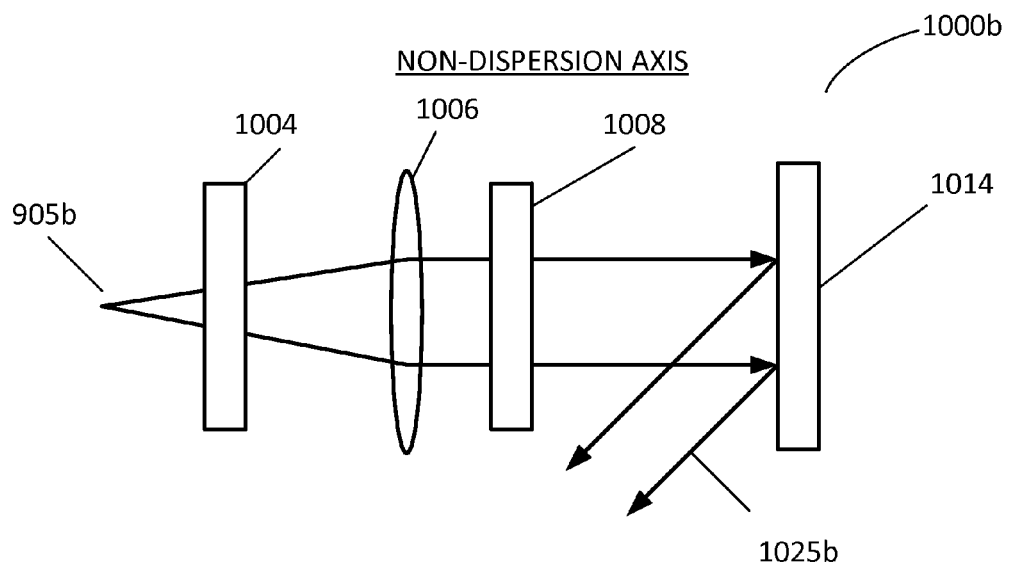

FIGS. 10A and 10B show a spatial and wavelength combiner implementation for use with the resonator configurations shown in FIGS. 8A-9B. Along the dispersion axis 1000a the optical elements consist of a chief ray collimator 1004 and a transform optic 1008. The collimator takes the overlapped chief rays from input (805a, 905a) at the grating (814, 914) and makes them parallel. The transform optic 1008 then spatially overlaps all the chief rays onto the grating 1014. As such there is only one combined output beam 1025a along this dimension. Along the non-dispersion axis 1000b a single lens chief ray collimator 1006 is all that is needed for 905b. A slightly modified system for 805b would be needed. Each of these optical elements are cylindrical optics. However, in practice, some cylindrical optics may be replaced/combined to form a spherical optics.

Hybrid System

Figure 13A:
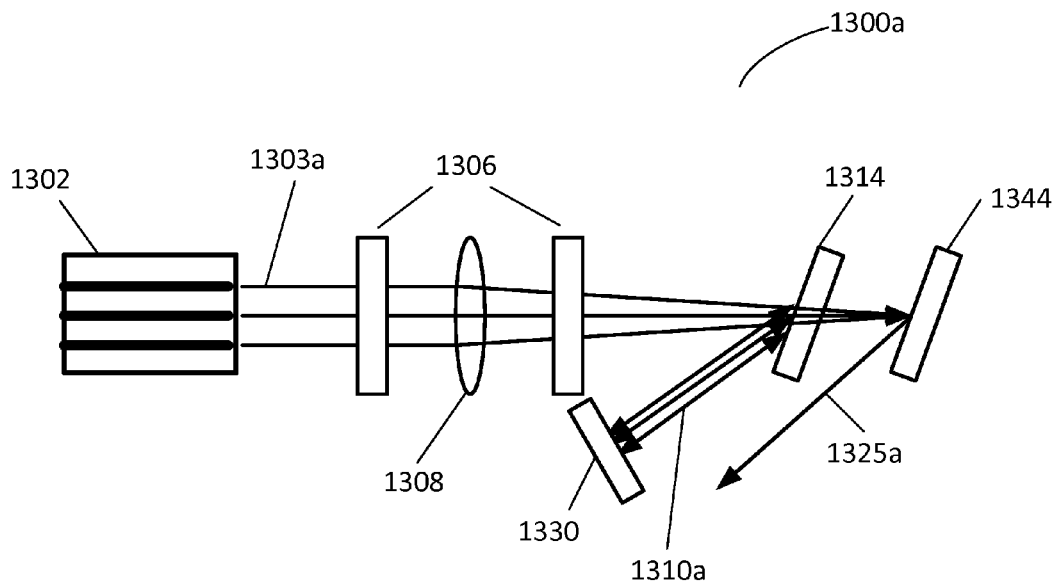
FIGS. 13A-B illustrate a hybrid wavelength stabilizer/combiner cavity embodiment where optical elements are shared.
Figure 13B:
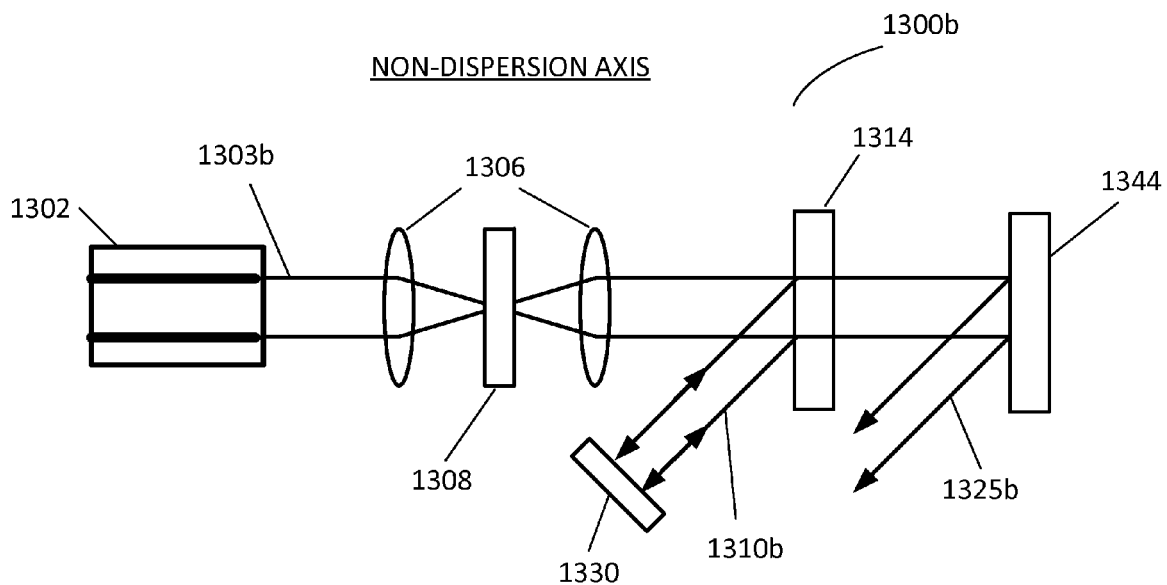

FIGS. 13A-B illustrate a hybrid version of a Wavelength Stabilizer and Combiner where optics for resonator and combiner are shared. The transform optic 1308 converts all the near field positions of emitted beams 1303a into angles along the dispersion dimension 1300a. The combination of mirror 1330 and first grating 1314 stabilize the gain elements 1302 by sending feedback 1310a to produce unique wavelengths. The wavelength combiner grating 1344 is placed at the position where all the emitted beams are overlapped. Thus, a single output beam 1325a is produced along the dispersion/combing dimension 1300a. Telecentric optics 1306, along the non dispersion dimension 1300b, direct images of the emitted beams 1303b onto the mirror 1330 and combiner grating 1344.

The efficiency of the diffraction grating in most systems is often dependent on the polarization of the laser. Using a wave plate, inserted between the grating and the source, is one way used to match the polarization. This is particularly useful when diode bars or other asymmetric beams are used as the emission source. As a result, by using this technique, about 90% of the light is diffracted into the first order and 10% is diffracted into the 0th order and wasted. Alternatively, without a wave plate about 10% of the light is diffracted into the first order and the remaining goes into the zero order.

Figure 14:
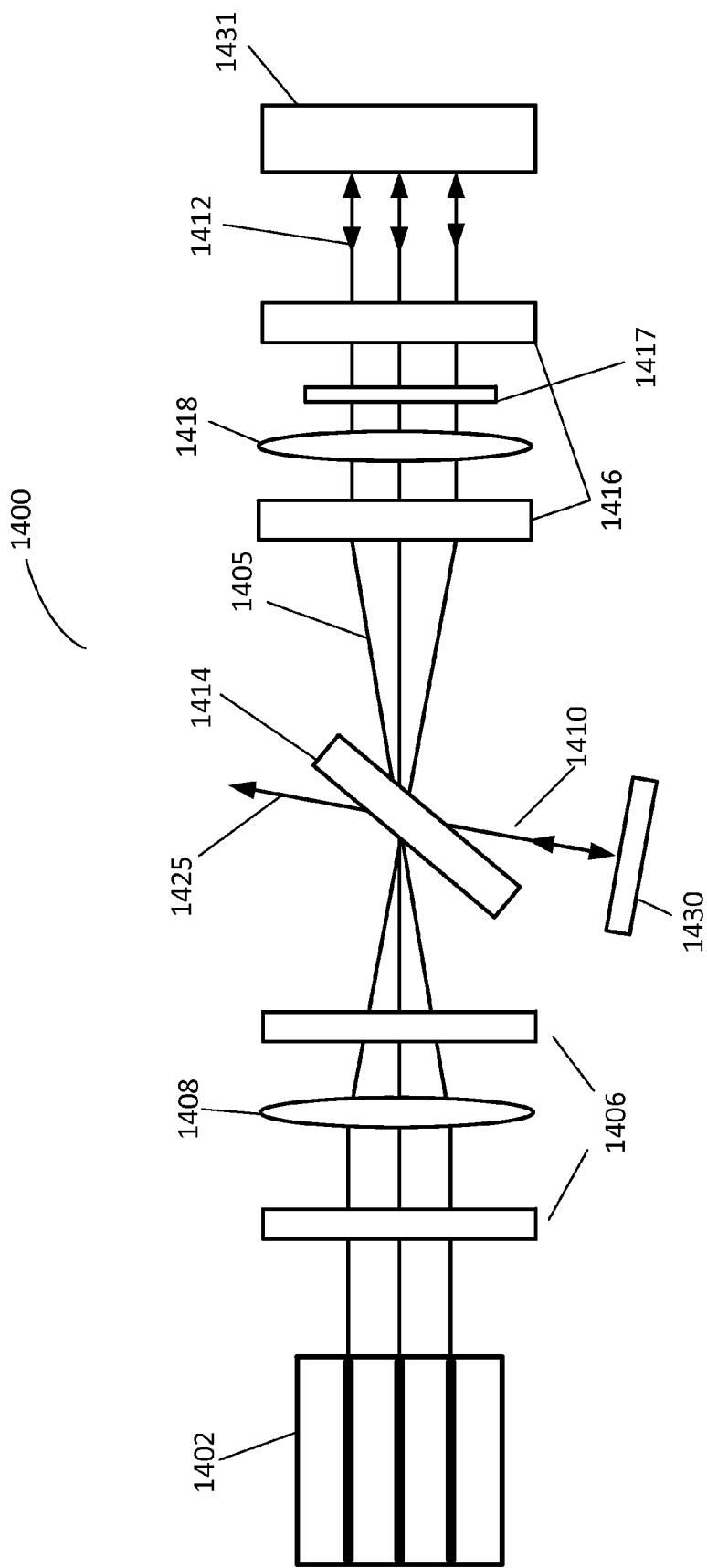
FIG. 14 illustrates another hybrid wavelength stabilizer/combiner cavity embodiment where the dispersive element is shared.

FIG. 14 illustrates another hybrid version wavelength combiner and stabilizer system. In hybrid wavelength stabilizer/combiner 1400, wave plate 1417 is positioned between grating 1414 and a second reflective surface 1431. Emitters 1402 emit a beam that is overlapped onto the diffraction grating 1414 by a transform optic 1408 where in some configurations approximately 90% of the light is diffracted into the 0th order and transmitted towards second reflective surface 1431 while the remaining 10% is diffracted in the $1^{st}$ order and directed toward a first reflective surface 1430. It should be noted that the amount of light diffracted and transmitted through a grating may vary. For example, some gratings allow for 90% of the $1^{st}$ order to be transmitted through the grating (if polarization is aligned), others allow up to 95% and even up to 99%. However, gratings with higher allowance percentages of light in a single order that is transmitted are difficult and expensive to manufacture and buy.

Feedback 1410 from the first reflective surface 1430 is directed back onto diffraction grating 1414 where a majority (the $0^{th}$ order from 1430 as the source) transmits as output 1425 as a combined multi-wavelength beam. Another portion small (the $1^{st}$ order from 1430 as the source) is redirected back into emitters 1402 and used to stabilize the emitters with unique wavelengths based on the angle of each beam was directed onto grating 1414. Similar to other embodiments described herein telecentric optics 1406 are used along the non-dispersive direction (not shown) to stabilize the emitters in that dimension.

The original 90% of light 1405, transmitted from emitters 1402, into the $0^{th}$ order towards second reflective surface 1431, is collimated with optical element 1418, 1405 then passes through a quarter wave-plate 1417 and is reflected back as feedback 1412 to grating 1414 by second reflective surface 1431, where the beams are now polarized another quarter and become orthogonal to the original $0^{th}$ order (1405) directed toward 1431. Optical element 1418 now overlaps the returning beam 1412 onto grating 1414 where a majority transmits as output 1425 and a smaller polarized portion is directed back into emitters 1402. This polarized feedback does not influence the stabilization of emitters 1402 and in some cases is of a negligible amount and becomes reabsorbed as heat in the system. Telecentric optics 1416 perform a similar function in the combiner portion of the system as 1406 in the stabilize portion of the system both having power along the non-dispersive dimension. Thus, the output beam 1425 is a combination feedback 1410 and 1410 that forms a multi-wavelength stabilized output. In this system the stabilizer/resonator portion is comprised of optical elements 1406, 1408, 1414 and 1430, while the combiner portion is comprised of optical elements 1414, 1416, 1417, 1418, and 1431, where 1414 is shared between each portion.

Figure 15:
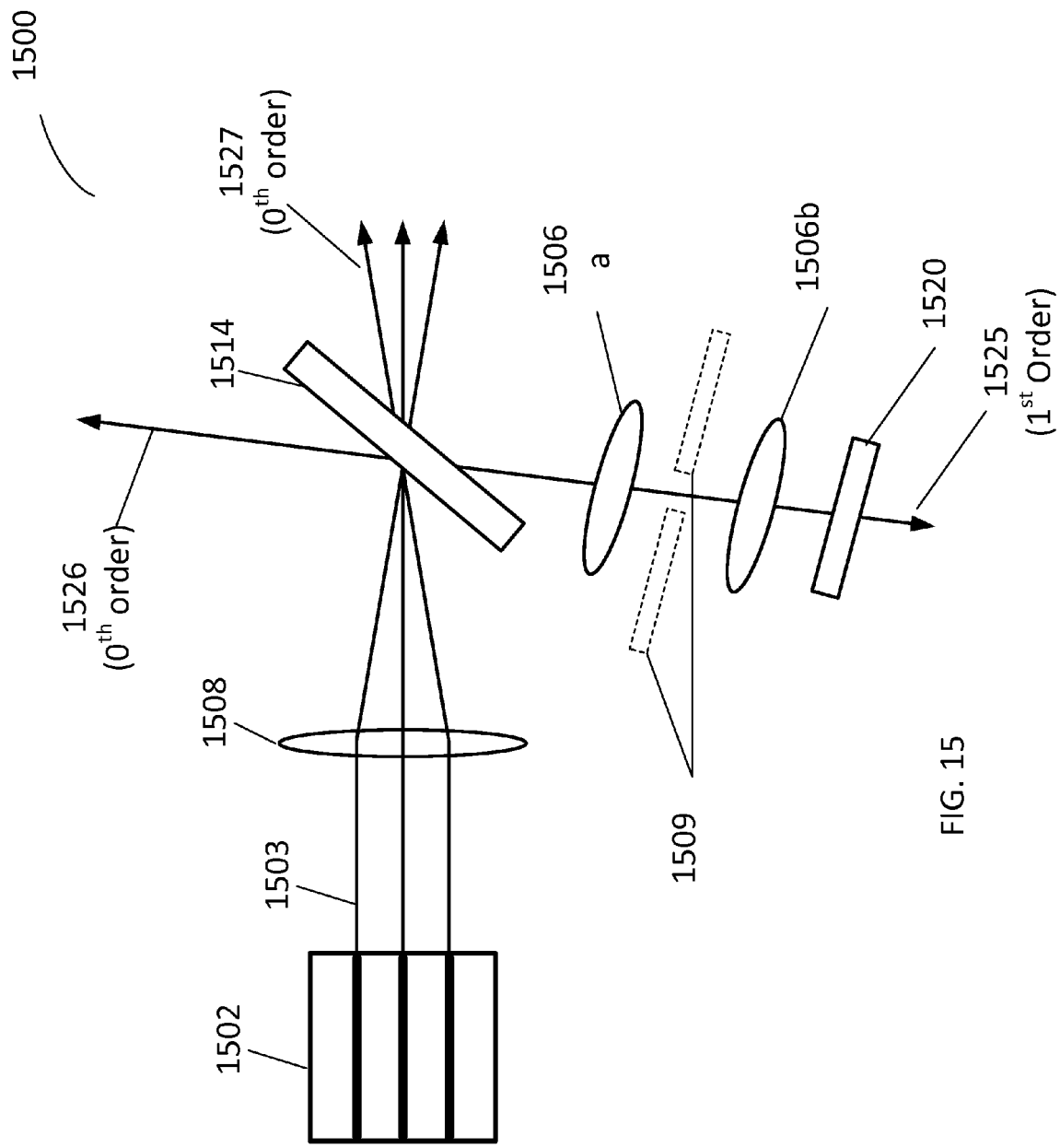
FIG. 15 illustrates a conventional WBC cavity where the output coupler is placed on the 1st order of the diffraction grating.

As shown above and in other WBC architecture systems the $1^{st}$ order of dispersed light from the grating is used to stabilize the emitters. FIG. 15 shows a 3-lens, 1-D WBC resonator system 1500. As shown, in FIG. 15 there are three sets of beams (1525, 1526, and 1527) dispersed from grating 1514. In this embodiment, there are two $0^{th}$ order (1526, 1527) and one first order (1525) beams. The first order beam is the output beam 1525 and is the brightest. Transform optic 1508 overlaps emitted beams 1503 onto grating 1514 thereby producing three sets of diffracted beams 1525, 1526, and 1527. A partially reflective output coupler 1520 is used to redirect some of the $1^{st}$ order beam back into the emitters 1502 and wavelength stabilize the system. An afocal telescoping system 1506a-b is used with an optional slit 1509 to help reduce cross-talk. Beam dumps are generally needed for 1526 and 1527.

Figure 16:
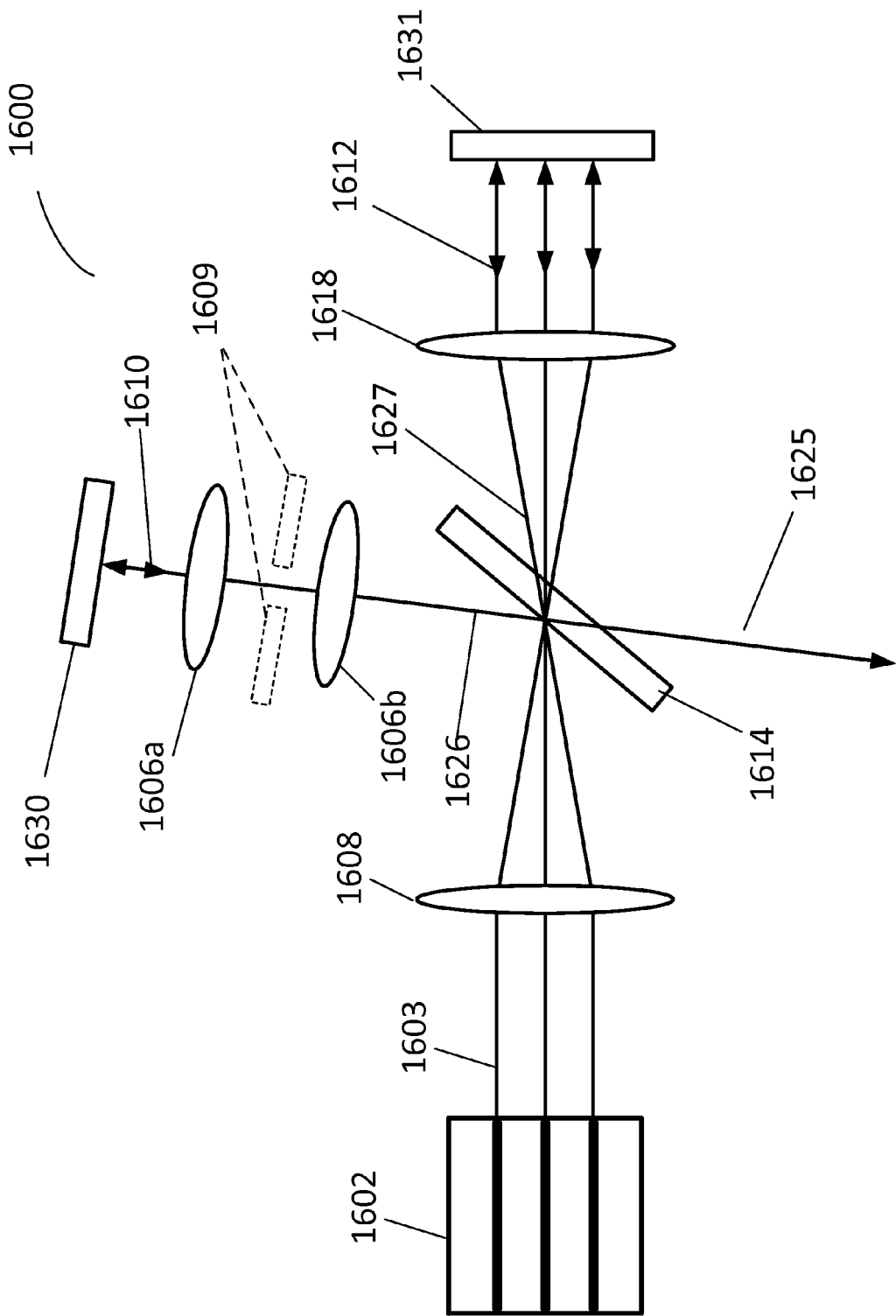
FIG. 16 illustrates a hybrid WBC system using $0^{th}$ order feedback to stabilize the emitters.

FIG. 16 illustrates a WBC architecture hybrid system that is fundamentally different from the previous embodiments wherein instead of using the first order beam (1625) to wavelength stabilize emitters 1602 the $0^{th}$ order beam 1627, which is reflected by first mirror 1631 as feedback 1612 is used. By using the $0^{th}$ order to stabilize the emitters 1602 in this new implementation a number of limitations associated with a $1^{st}$ order cavity are overcome. These limitations are: higher efficiency cavity, easier to align optics at high power, and easier to design beam shaping optics. 1600 may be modified and apply to all WBC cavities (1-D and 2-D WBC of 1-D and 2-D laser/amplifier elements).

Contrasting 1600 with 1500 shown in FIG. 15, embodiment 1600 comprises a first transform lens/afocal telescope 1608, diffraction grating 1614, a second transform lens/afocal telescope 1618, a first mirror 1631, expanding optical elements/system 1606a-b, optional slit 1609, and second mirror 1630. The output beam 1625 is taken from the $1^{st}$ diffraction order of the grating 1614. All the emitted beams 1603 are overlapped onto the diffraction grating 1614 by first transform lens 1608. The $0^{th}$ order 1627 beam (shown as transmitting through the grating) is intercepted by 1618, 1608 and 1618 form an afocal telescope system. The emitters 1602 are at the focal plane of 1608 and the first mirror 1631 is at the focal plane of 1618. The separation between the two lenses (1608, 1618) is the sum of their respective focal lengths. Thus, as such, real images of the emitters 1602 are formed at the first mirror 1631.

When the images are reflected off the first mirror 1631 as feedback 1612 they pass through 1618 a second time. Now 1618 functions as a transform lens for feedback 1612 (the real images of the elements) and overlaps the beams onto the diffraction grating 1614. A portion of feedback 1612 is now redirected into emitters 1602 as wavelength stabilized feedback, while another portion is directed towards second mirror 1630, or opposite in angle to the $1^{st}$ order diffracted beam 1603. An expanding/contracting optical system 1606a-b is used to reduce cross-talk and may be used with an optional slit 1609. The ratio of focal lengths between optical elements 1606a:1606b may be in the range of 1:10, 1:25, or 1:100. 1626 is reflected by second mirror 1630 as feedback 1610 where a majority is redirected towards first mirror 1631 and a portion transmits on as output 1625, which is comprised of transmitted 1610 and the $1^{st}$ order of diffracted light of 1603. One of the advantages of this type of system are a majority of the light gets re-circulated and utilized, while no beam dumps are required.

In many of the embodiments described herein a two-dimensional array of radiation elements or emitters are stabilized along the non-dispersive direction through use of a telecentric optical system, while a second telecentric optical system is used in the wavelength beam combiner side of the multi-beam high brightness output laser system. Along the dispersive dimension and combining dimensions embodiments have been discussed herein using single dispersive element such as a diffraction grating to 1) assist in stabilizing unique wavelengths along the dispersion direction and another dispersive element along the beam combining dimension to 2) overlap each of the unique beams into a single multi-beam output profile. However, as discussed and shown a system using a common dispersive element to 1) stabilize unique wavelengths and 2) later combine the unique wavelengths in a second step (referred to as a hybrid system) along the same common dispersive element or grating requires only a single grating.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed:

1. A multi-beam stabilizer and combining system comprising:
    a two-dimensional wavelength stabilizer having a dispersive and non-dispersive dimension comprising:
        an array of beam emitters each emitting a beam,
        a first dispersive element, and
        telecentric optics positioned and having power along the non-dispersive dimension to image the emitted beams onto the first dispersive element,
        wherein the first dispersive element (i) reflects a portion of the emitted beams back into each beam emitter, thereby forming a resonator with each beam emitter that stabilizes the beam emitted by each beam emitter to a unique wavelength, and (ii) transmits a portion of the dispersed beams, each transmitted portion having the unique wavelength emitted by the beam emitter associated therewith; and
    a wavelength combiner having a dispersive and non-dispersive dimension comprising:
        a combining optical element, different from the first dispersive element, arranged to receive the dispersed beams, and cause the beams to converge along a beam combining dimension, and
        a second dispersive element, positioned along a beam combining dimension, to receive the plurality of converging beams, and transmit the beams as a multi-wavelength output away from the array of beam emitters.

2. The multi-beam stabilizer and combining system of claim 1, wherein the wavelength stabilizer comprises a transform optic configured to cause the emitted beams along the dispersive dimension to converge towards the first dispersive element.

3. The multi-beam stabilizer and combining system of claim 1, wherein the first dispersive element is a chirped grating.

4. The multi-beam stabilizer and combining system of claim 1, wherein the wavelength combiner comprises a second telecentric optic system having optical power along the non-dispersive dimension and positioned to receive transmitted beams from the first dispersive element and image those beams onto the second dispersive element.

5. A multi-beam stabilizer and combining system comprising:
    a two-dimensional wavelength stabilizer having a dispersive and non-dispersive dimension comprising:
        an array of beam emitters each emitting a beam,
        at least one transform optical element having power in the dispersive dimension placed to receive and cause the beams to converge,
        a first dispersive element placed to receive the converging beams from the transform optical element and disperse the beams into at least two orders, wherein one of the orders is transmitted, and
        a reflective surface configured to receive the non-transmitted order, reflect the order back onto the first dispersive element, through the transform optical element and into each of the emitters, wherein a resonator is formed between the mirror and a back facet of each of the emitters to thereby stabilize the beam emitted by each beam emitter to a unique wavelength; and
    a wavelength combiner having a dispersive and non-dispersive dimension comprising:
        a combining optical element, different from the first dispersive element, arranged to receive the transmitted order of beams, and cause the transmitted beams to converge along a beam combining dimension, and
        a second dispersive element, positioned along a beam combining dimension, to receive the converging beams, and transmit the beams as a multi-wavelength output away from the array of beam emitters.

6. The multi-beam stabilizer and combining system of claim 5, wherein the wavelength stabilizer comprises telecentric optical elements having power in the non-dispersive dimension placed between the emitters and first dispersive element.

7. The multi-beam stabilizer and combining system of claim 5, wherein the first dispersive element is a transmission grating.

8. The multi-beam stabilizer and combining system of claim 5, wherein the wavelength combiner comprises a collimating optical element having optical power along the dispersive dimension, wherein the collimating optical element is positioned to receive the transmitted beams, collimate the beams and transmit them onto the combining optical element.

9. The multi-beam stabilizer and combining system of claim 5, wherein the wavelength combiner comprises an imaging optical element having power along the non-dispersive dimension, and positioned to receive the transmitted beams form the image of the array of emitters along the non-dispersive dimension onto the second dispersive element.

10. A multi-beam stabilizer and combining system comprising:
a two-dimensional wavelength stabilizer having a dispersive and non-dispersive dimension comprising:
an array of beam emitters each emitting a beam, wherein each emitter has a front facet and a partially reflective back facet,
a first dispersive element, and
telecentric optics positioned having power along both the dispersive and non-dispersive dimension to image emitted beams from the front facet onto the first dispersive element,
wherein the first dispersive element reflects the emitted beams back into each beam emitter, the back facet of each emitter transmitting a portion of a beam therethrough and reflecting a second portion back toward the first dispersive element, thereby forming a resonator, between the first dispersive element and the back facet of each emitter, which stabilizes the beam emitted by each beam emitter to a unique wavelength; and
a wavelength combiner having a dispersive and non-dispersive dimension comprising:
a combining optical element arranged to receive the transmitted dispersed beams from the back facet of each emitter, and cause the beams to converge along a dispersive dimension, and
a second dispersive element, positioned along a dispersive dimension, to receive the plurality of converging beams, and transmit the beams as a combined multi-wavelength output away from the array of beam emitters.

11. A multi-beam stabilizer and combining system comprising:
a two-dimensional wavelength stabilizer having a dispersive and non-dispersive dimension comprising:
an array of beam emitters each emitting a beam,
a polarizing optical element configured to redirect a portion of the emitted beams and transmit another portion of the beams,
a first dispersive element, and
telecentric optics having optical power along the dispersive and non-dispersive dimension that are positioned after the polarizing optical element to image the transmitted beams from the emitters onto the first dispersive element, and wherein the first dispersive element reflects the beams back into each emitter thereby forming a resonator between the first dispersive element and the back facet of each emitter that stabilizes the beam emitted by each beam emitter to a unique wavelength; and
a wavelength combiner having a dispersive and non-dispersive dimension comprising:
a combining optical element, different from the first dispersive element, arranged to receive the dispersed beams from the polarizing optical element, and cause the beams to converge along a beam combining dimension,
a second dispersive element, positioned along a beam combining dimension, to receive the plurality of converging beams, and transmit the beams as a multi-wavelength output away from the array of beam emitters.

12. A method of stabilizing and combining a two-dimensional array of emitters each emitting a beam, the method comprising the steps of:
forming a stabilizer cavity wherein each emitter forms a resonator with an external reflective surface to thereby stabilize the beam emitted by each emitter to a unique wavelength, wherein each beam emitted of the array of emitters is introduced to a dispersive element disposed within the resonator between the array of emitters and the external reflective surface;
transmitting the beams of the stabilizer from the dispersive element into a wavelength combiner comprising at least one combining optical element; and
combining the beams along one dimension to form a multi-wavelength beam output that is transmitted away from the array of emitters.

13. The method of claim 12, wherein the wavelength combiner further comprises a second dispersive element.

14. A multi-beam stabilizer and combining system comprising:
a two-dimensional wavelength stabilizer having a dispersive and non-dispersive dimension comprising:
an array of beam emitters each emitting a beam,
at least one optical element having power in the dispersive dimension placed to receive and converge each beam, and then transmit converging beams,
a first dispersive element placed to receive the converging beams from the optical element and disperse the beams into at least two orders, wherein one of the orders is transmitted as a converging order of beams, and
a reflective surface configured to receive the non-transmitted order, reflect the order back onto the first dispersive element, through the at least one optical element and into each of the beam emitters, wherein a resonator is formed, between the mirror and a back facet of each of the emitters, which stabilizes the beam emitted by each beam emitter to a unique wavelength; and
a wavelength combiner having a dispersive and non-dispersive dimension comprising:
a second dispersive element, different from the first dispersive element, positioned along a beam combining dimension, to receive the plurality of converging beams, and transmit the beams as a multi-wavelength output away from the array of beam emitters.

15. A multi-beam stabilizer and combining system comprising:
an array of beam emitters each emitting a beam;
a central dispersive element configured to disperse the emitted beams into at least $0^{th}$ and $1^{st}$ orders;
a first transform lens positioned between the dispersive element and the beam emitters, wherein the first transform lens has power along a combining dimension to receive and cause the emitted beams to converge onto the dispersive element;
a first reflective surface;

a second transform lens positioned after the dispersive element at a distance of the combined focal lengths of the first and second transform lenses, wherein the second transform lens receives the $0^{th}$ dispersed order, collimates the $0^{th}$ order and transmits the $0^{th}$ order beams toward the first reflective surface;

a quarter-wave plate positioned between the second transform lens and the first reflective surface, which is configured to rotate beams propagating therethrough by a quarter each pass; and a second reflective surface positioned to receive and reflect the $1^{st}$ order as feedback onto the dispersive element and into each of the emitters, wherein a resonator is formed, between the back facet of each emitter and the second reflective surface, which stabilizes the beam emitted by each beam emitter to a unique wavelength, wherein the dispersive element transmits a portion of the $1^{st}$ order beams reflected by the second reflective surface as a multi-wavelength output beam away from the array of beam emitters, the multi-wavelength output beam further comprising at least a portion of the light reflected by the first reflective surface back to the dispersive element.

16. The multi-beam stabilizer and combining system of claim 15, further comprising telescoping optics having power along a non-dispersive dimension and positioned between the emitters and dispersive element.

17. A multi-beam stabilizer and combining system comprising:

an array of beam emitters each emitting a beam;

a dispersive element;

a first transform lens positioned to receive the emitted beams and cause each beam to overlap onto the dispersive element, wherein a diverging $0^{th}$ order, and $1^{st}$ order beams are produced;

a first reflective surface; and a second transform lens configured to receive the $0^{th}$ order beams, collimate the $0^{th}$ order beams and transmit them onto a first reflective surface, wherein the first reflective surface redirects the collimated $0^{th}$ order beams as feedback to the second transform lens, which then causes the feedback to converge onto the dispersive element, wherein (i) a portion of the feedback is directed into the emitters as wavelength-stabilized feedback thereby stabilizing the beam emitted by each beam emitter to a unique wavelength, and (ii) a second portion is directed towards a second reflective surface, wherein a third portion of feedback from the second reflective surface is directed back towards the first reflective surface and a fourth portion of feedback from the second reflective surface is transmitted by the dispersive element, wherein the fourth portion of feedback from the second reflective surface combines with the $1^{st}$ order beam produced by the dispersive element to form a multi-wavelength output beam transmitted away from the array of beam emitters.

18. The multi-beam stabilizer and combining system of claim 17 further comprising expanding optics positioned between the dispersive element and the second reflective surface.

19. The multi-beam stabilizer and combining system of claim 18, wherein the expanding optics comprise at least two lenses having a ratio of focal lengths in the range of 1:10.

20. The multi-beam stabilizer and combining system of claim 17, wherein the $1^{st}$ order beam diffracted by the dispersive element is a combined multi-wavelength stabilized beam along at least one dimension.

\* \* \* \* \*